US012653078B2

(12) United States Patent
Chuah et al.

(10) Patent No.: US 12,653,078 B2
(45) Date of Patent: Jun. 9, 2026

(54) INTERCONNECTION STRUCTURE WITH LIQUID METAL AND SURFACE PINS AND REMOVABLE MAGNET OR GUIDEPOSTS ALIGMENT AROUND PACKAGE SUBSTRATE

(71) Applicant: Intel Corporation, Santa Clara, CA (US)

(72) Inventors: Tin Poay Chuah, Bayan Baru (MY); Jeff Ku, Taipei City (TW); Min Suet Lim, Gelugor (MY); Yew San Lim, Gelugor (MY); Twan Sing Loo, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 17/834,674

(22) Filed: Jun. 7, 2022

(65) Prior Publication Data

US 2023/0395480 A1     Dec. 7, 2023

(51) Int. Cl.
| | |
|---|---|
| *H10W 70/65* | (2026.01) |
| *H05K 1/11* | (2006.01) |
| *H05K 3/341* | (2026.01) |
| *H10W 70/05* | (2026.01) |
| *H10W 70/63* | (2026.01) |
| *H10W 90/00* | (2026.01) |

(52) U.S. Cl.
CPC .......... *H10W 90/701* (2026.01); *H05K 1/115* (2013.01); *H05K 3/3436* (2013.01); *H10W 70/093* (2026.01); *H10W 70/635* (2026.01); *H10W 70/65* (2026.01); *H05K 2201/0154* (2013.01); *H05K 2201/10303* (2013.01); *H05K 2201/10378* (2013.01); *H05K 2201/10734* (2013.01)

(58) Field of Classification Search
CPC ........... H01L 21/4853; H01L 23/49811; H01L 23/49827; H01L 23/49838; H01L 23/5385; H05K 1/115; H05K 1/141; H05K 3/3436; H05K 3/368; H05K 2201/0154; H05K 2201/10378; H05K 2201/10734
See application file for complete search history.

(56) References Cited

U.S. PATENT DOCUMENTS

| | | | | |
|---|---|---|---|---|
| 4,655,516 | A | * | 4/1987 | Shaffer et al. ............ 339/17 CF |
| 5,610,371 | A | * | 3/1997 | Hashimoto et al. .......... 174/262 |
| 2009/0001576 | A1 | * | 1/2009 | Tuli et al. ...................... 257/750 |
| 2009/0273083 | A1 | * | 11/2009 | Sauciue et al. ............... 257/741 |

(Continued)

*Primary Examiner* — Wael M Fahmy
*Assistant Examiner* — Alice W Tang
(74) *Attorney, Agent, or Firm* — Alliance IP, LLC

(57)     ABSTRACT

A substrate to printed circuit board (PCB) interconnect with liquid metal and surface pins. A thin dielectric sheet with drilled openings is adjacent to the bottom of a system on chip or CPU package substrate. Holes in the dielectric sheet have a liquid metal (LM) therein, the holes correspond to landing metal pads on the package substrate. The PCB includes surface pins in an arrangement to match the LM filled holes. A pick and place assembly of the package substrate to the PCB can be done without needing a reflow step. A magnet ring can be positioned on the polyimide sheet and configured to pair with a metal plate on the PCB. Guideposts around the periphery of the package substrate may be used to assist in alignment during assembly.

25 Claims, 10 Drawing Sheets

(56)          References Cited

U.S. PATENT DOCUMENTS

2015/0147896 A1*  5/2015  Ju  ......................... H01R 12/718
2018/0358280 A1*  12/2018  Gandhi et al.  ...... H01L 23/3675
2019/0304950 A1*  10/2019  Israel et al.  ............. H01L 24/97

* cited by examiner

Figure 4:
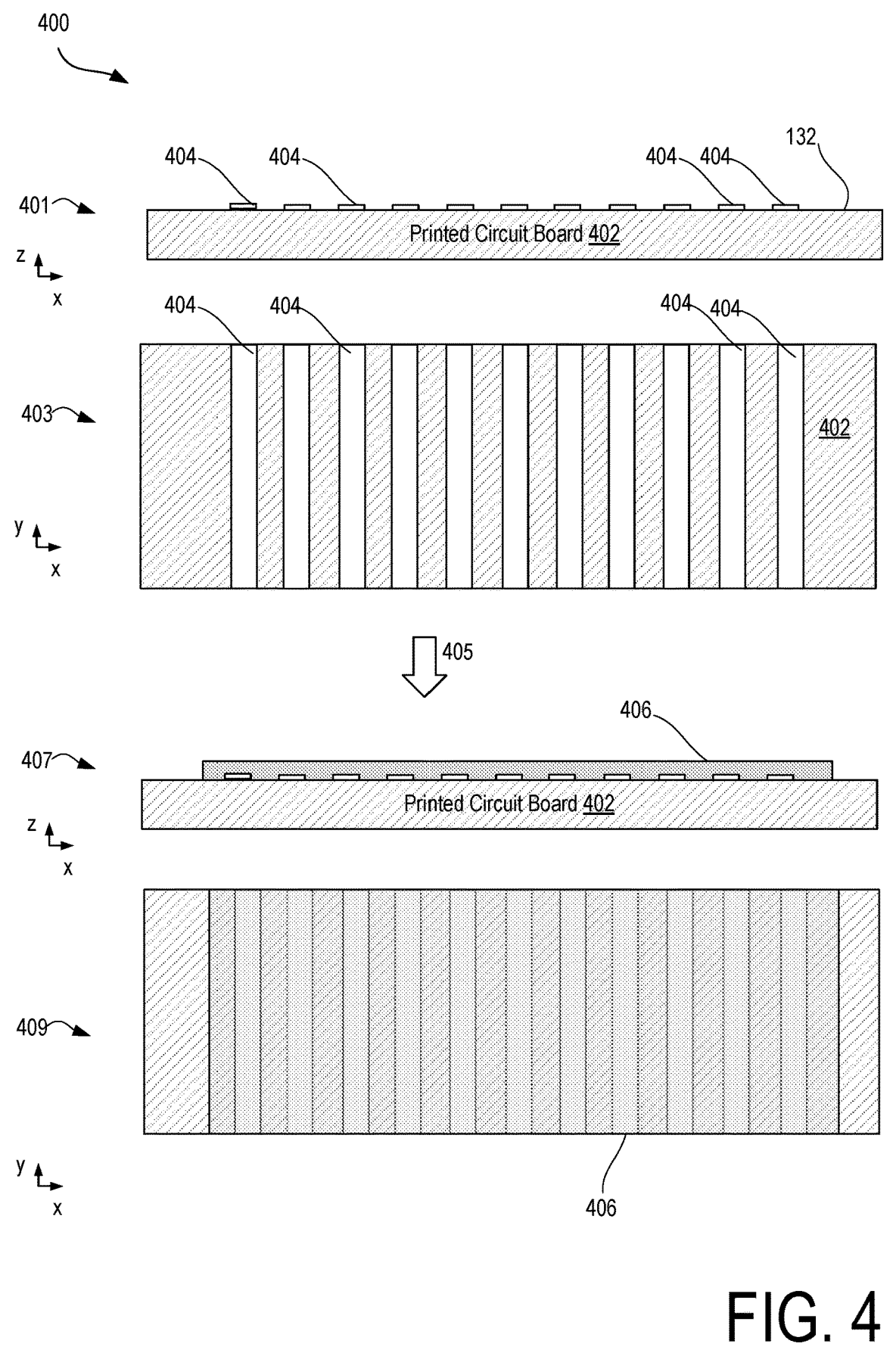

400

404  404                              404  404    132

401

Printed Circuit Board 402 z
 x 404      404                  404  404

403

402 y
 x

405

406

407

Printed Circuit Board 402 z
 x

MAIN BOARD 1003　　　　　　　　　　HOUSING 1001

1000

PROCESSOR UNIT
1002

COMMUNICATION COMPONENT
1012

MEMORY
1004

BATTERY/POWER
1014

DISPLAY DEVICE
1006

GNSS DEVICE
1018

AUDIO OUTPUT DEVICE
1008

AUDIO INPUT DEVICE
1024

AN OTHER OUTPUT DEVICE
1010

AN OTHER INPUT DEVICE
1020

ANTENNA 1022

INTERCONNECTION STRUCTURE WITH LIQUID METAL AND SURFACE PINS AND REMOVABLE MAGNET OR GUIDEPOSTS ALIGMENT AROUND PACKAGE SUBSTRATE

BACKGROUND

Package substrate to printed circuit board (PCB) interconnect is generally achieved using ball grid array (BGA) or land grid array (LGA) packaging technologies. The BGA and LGA packaging technologies have respective technical limitations when it comes to replacement and upgrade.

BRIEF DESCRIPTION OF THE DRAWINGS

FIG. 4 and FIG. 5 illustrate features of the PCB, by way of an example process for manufacturing PCB, in accordance with various embodiments.

DETAILED DESCRIPTION

Figure 1:
FIG. 1 illustrates an exemplary package substrate and printed circuit board for assembly, in accordance with various embodiments.

The following detailed description is merely exemplary in nature and is not intended to limit the application and uses. It may be evident that the novel embodiments can be practiced without every detail described herein. For the sake of brevity, well known structures and devices may be shown in block diagram form in order to facilitate a description thereof.

Substrate to printed circuit board (PCB) interconnect is generally achieved using ball grid array (BGA) or land grid array (LGA) packaging technologies.

The BGA packages tend to be smaller, and the BGA packages are generally soldered directly onto a PCB. Defect issues, such as warpage of a BGA package or the respective PCB board, which can put untenable stress on solder joints, and upgrade issues, require removal and replacement of the BGA. For a BGA package that has been direct soldered down, the only way to replace or repair it is to use a BGA rework station, where heat is applied to melt the BGA solder contacts and remove them from the PCB. In many cases, the removal process is destructive and the BGA device that was removed has to be scrapped. Additionally, this complicated service or repair process for the BGA devices can lead to component failure after multiple hot temperature reflows.

Also, while BGA package core thickness can be increased to increase stiffness, increased package thickness is a concern, especially, for mobile designs that are sensitive to package height and overall system height. These technical challenges related to BGA packages are growing as package size grows.

One solution is to move to LGA packages. However, LGA packages are bigger, and they require a respective socket and lid. The combination of the socket, LGA package, and lid take up a large amount of real estate and height on the main board. The additional real estate and height may not be acceptable in many device applications. Additionally, the LGA package requires a compression force of 20-30 g/pin to ensure a good contact resistance, and this compression force is projected to increase with increasing pin count and package size. Moreover, as LGA socket and lid design become bigger, they occupy a larger component keep out zone (KOZ). Additionally, improvements to the LGA socket and lid design can be costly. For these reasons, LGA packages also present technical challenges.

The present disclosure provides a technical solution to the above-described problems, in the form of a substrate to board interconnect with liquid metal and surface pins. As is described in more detail below, embodiments introduce a packaging apparatus and methodology using a thin dielectric sheet with drilled openings having a liquid metal therein. The dielectric sheet attaches to the bottom of a system-on-chip or CPU substrate package, enabling electrical communication between the substrate package and a board when the board has the herein described surface pins; a magnet may be positioned on the dielectric sheet to pair with a metal plate on the board (for alignment), and guideposts can also be used to assist with alignment.

Exemplary embodiments will hereinafter be described in conjunction with the following drawing figures, wherein like numerals denote like elements. Figures are not necessarily to scale but may be relied on for spatial orientation and relative positioning of features. As may be appreciated, certain terminology, such as "ceiling" and "floor", as well as "upper, ", "uppermost", "lower," "above," "below," "bottom," and "top" refer to directions based on viewing the Figures to which reference is made. Further, terms such as "front," "back," "rear,", "side", "vertical", and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "adjacent" refers to layers or components that are in direct physical contact with each other, with no layers or components in between them. For example, a layer X that is adjacent to a layer Y refers to a layer that is in direct physical contact with layer Y. In contrast, as used herein, the phrase(s) "located on" (in the alternative, "located under," "located above/over," or "located next to," in the context of a first layer or component located on a second layer or component) includes (i) configurations in which the first layer or component is directly physically attached to the second layer (i.e., adjacent), and (ii) component and configurations in which the first layer or component is attached (e.g. coupled) to the second layer or component via one or more intervening layers or components.

The term "overlaid" (past participle of "overlay") may be used to refer to a layer to describe a location and orientation for the layer but does not imply a method for achieving the location and orientation. For example, a first layer overlaid on a second layer, or overlaid on a component means that the first layer is spread across or superimposed on the second layer or component. Accordingly, a layer that is overlaid on a second layer may be viewed in a cross-sectional view as adjacent to the second layer.

As used herein, the term "electronic component" can refer to an active electronic circuit (e.g., processing unit, memory, storage device, FET) or a passive electronic circuit (e.g., resistor, inductor, capacitor).

As used herein, the term "integrated circuit component" can refer to an electronic component configured on a semi-conducting material to perform a function. An integrated circuit (IC) component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller, and can comprise one or more additional active or passive devices such as capacitors, decoupling capacitors, resistors, inductors, fuses, diodes, transformers, sensors, electrostatic discharge (ESD) devices, and memory devices.

A non-limiting example of an unpackaged integrated circuit component includes a single monolithic integrated circuit die (shortened herein to "die"); the die may include solder bumps attached to contacts on the die. When present on the die, the solder bumps or other conductive contacts can enable the die to be directly attached to a printed circuit board (PCB).

A non-limiting example of a packaged integrated circuit component comprises one or more integrated circuit dies mounted on a package substrate with the integrated circuit dies and package substrate encapsulated in a casing material, such as a metal, plastic, glass, or ceramic. Often the casing includes an integrated heat spreader (IHS); the packaged integrated circuit component often has bumps or leads attached to the package substrate for attaching the packaged integrated circuit component to a printed circuit board or motherboard.

FIG. 1 is a cross-sectional view of an example showing components for integrated circuit device assembly 100 including a substrate to printed circuit board (PCB) interconnect with liquid metal (LM) and PCB surface pins, in accordance with embodiments of the present disclosure. In the example shown, the assembly 100 includes a PCB 102, which may be a main board, a motherboard, a system board, or the like. The PCB 102 may include multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the main board, which may be the PCB 102.

The assembly 100 also includes a package 120. In various embodiments, the package 120 includes a package substrate 112, an integrated circuit die 114 located on the package substrate 112, a thermal interface material (TIM) 116 located on the die 114, and a cap 118 enclosing the die 114 and TIM 116 on the top surface of the package substrate 112, as illustrated.

Figure 6:
FIG. 6 illustrates the assembly of the components of FIG. 1, in accordance with various embodiments.
Figure 6:
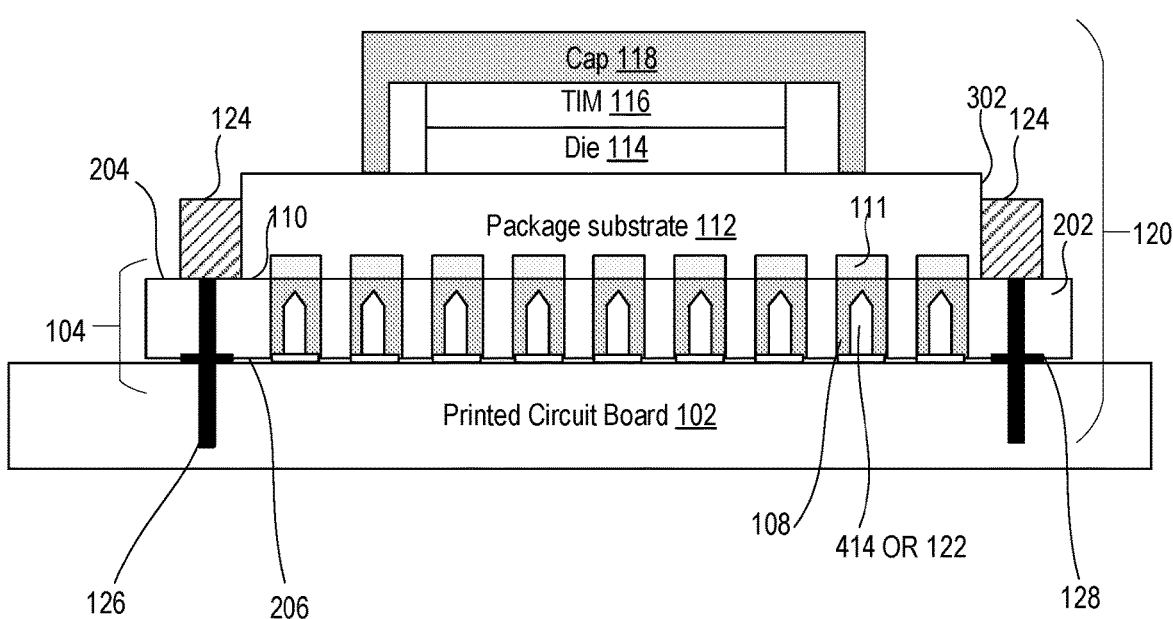

The components of the assembly 100 (package 120 and PCB 102) are shown separated in order to clearly depict features, however, in practice, and as illustrated in FIG. 6, the package 120 may be attached to the PCB 102, to facilitate an electrical connection between the package and the PCB 102, as indicated by arrows 134.

The package 120 may have its functionality informed by the integrated circuit die 114. The die 114 may be a packaged or unpacked integrated circuit product as described above. In some embodiments, the die 114 can comprise one or more additional active or passive devices such as capacitors, decoupling capacitors, resistors, inductors, fuses, diodes, transformers, sensors, electrostatic discharge (ESD) devices, and memory devices. In addition to comprising one or more processor units, the die 114 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. In practice, the die 114 may represent multiple separate integrated circuit dies addressing different portions of the overall functionality of the die 114, in these scenarios, the separate integrated circuit dies can be referred to as "chiplets." In embodiments where the die 114 comprises multiple chiplets, interconnections between the chiplets can be provided by the package substrate, one or more silicon interposers, one or more silicon bridges embedded in the package substrate (such as Intel® embedded multi-die interconnect bridges (EMIBs)), or combinations thereof.

The die 114 is coupled to the package substrate 112. The package substrate 112 includes a set of conductive contacts or metal pads 111 formed on the backside 110 or bottom of the package substrate 112, i.e., on the side opposite from the die 114, as depicted in FIG. 1. The metal pads 111 are electrically coupled to the die 114 and may be in a predefined arrangement on the backside 110 of the package substrate 112. The predefined arrangement can be referred to as a pinout, and the pinout may vary as a function of the specific die 114 in a given application. The metal pads 111 enable electrical connections and communication between the die 114 and other components in the assembly 100, such as the PCB 102.

Embodiments of the package 120 introduce an interposer 104 comprising a dielectric layer. The interposer 104 is configured to securely fit between the package substrate 112 and the PCB 102 when the package 120 is attached to the PCB 102, as indicated by the arrows 134. Specifically, in the assembly 100, the interposer 104 has an upper surface (FIG. 2, 204) that will be adjacent to the backside 110 of the package substrate and a lower surface (FIG. 2, 206) that will be adjacent to an upper surface 132 of the PCB 102. In various embodiments, the interposer 104 may comprise a polyimide layer that can be overlaid on the backside 110. The interposer 104 has a plurality of openings or through-holes that extend from the upper surface 204 to the lower surface 206 (shortened herein to holes 108); the holes 108 may be arranged in the predefined arrangement of the plurality of metal pads 111, such that individual holes 108 correspond, in a one-to-one correspondence, with a package land pad (metal pad 111) of the metal pads 111 in the predefined arrangement.

In an application, individual holes of the plurality of holes 108 may have a liquid metal (LM) therein. In various embodiments, individual holes of the plurality of holes 108 may be filled with a liquid metal (LM). In some embodiments, "filled" may mean that at least 80% of a volume of a hole 108 is taken up with the LM. The LM extends from the upper surface 204 to the lower surface 206 and functions as interconnect media. In various embodiments, the LM is part of the package 120, and package assembly 100. In various applications, the LM may be applied in a print and paste operation across the dielectric layer (e.g., FIG. 2, 202) overlaid a side of the package substrate having the metal pads 111. In various embodiments, the liquid metal (LM) can comprise any suitable liquid metal that is liquid at normal operating temperatures of a substrate assembly. In some embodiments, the LM comprises gallium or an alloy of gallium, such as, for example, alloys of gallium and indium, eutectic alloys of gallium, indium, and tin, and eutectic alloys of gallium, indium, and zinc. In various applications, the LM may be $Ga_2O_3$. In various embodiments of a package 120, the LM of an individual hole 108 is sufficient to electrically couple to a respective metal pad 111 at the upper surface 204. In various embodiments of an assembly (FIG. 6, 600), the LM of an individual hole 108 is sufficient to electrically couple to a respective surface pin 122, at least at the lower surface 206.

The package 120 may include a magnet 124 located on the upper surface 204 that substantially surrounds a perimeter or periphery 302 of an intended package substrate 112, as is indicated in FIG. 1. As used here, "substantially surrounds" means that the magnet 124 extends around 80% or more of the perimeter of the package substrate. In some embodiments, magnet 124 may be located at a periphery of a plurality of holes 108, or between the plurality of holes and an edge of the dielectric layer, such as a polyimide layer 202 shown in FIGS. 2 and 3. In some embodiments, magnet 124 is a magnetic ring or closed loop, when viewed in a top view (for reference, see top-down view in FIG. 3). In various embodiments, the magnet 124 is configured to be located above a respective metal plate 128 on the PCB 102, and to pair with the metal place 128 in the assembly 100, when the package 120 is attached to the PCB 102.

Embodiments of the package 120 may further include one or more guideposts 126. When guideposts 126 are included, the interposer 104 additionally comprises a respective hole (FIG. 2, 212) configured to receive a guidepost 126. Generally, the guideposts 126 are used to orient the package 120 on the PCB 102, and when employed, a guidepost 126 inserts into respective holes 130 in the PCB 102 in creating the assembly 100.

As shown, the PCB 102 is configured with (or modified to have) a set of surface pins 122 that are electrically coupled thereto. The surface pins 122 replace conventional PCB pads. The pins 122 enable an electrical connection between (i.e., electrically couple) the PCB 102 and the die 114. In various embodiments, the pins 122 individually include a sharp end as shown in FIG. 1 (the sharp ends point upward in FIG. 1). In various embodiments, the pins 122 may also be arranged in the predefined pattern. In various embodiments, the pins 122 comprise a conductive metal, such as copper. In various embodiments, the pins 122 comprise copper with an ENIG (Emersion Nickel Gold) finish.

Viewed individually, a pin 122 is configured to pierce or insert into a respective hole 108 in the interposer 104, contact the LM in the hole 108, and thereby make an electrical connection with a respective metal pad 111. Collectively, a plurality of pins 122 are configured to pierce the interposer 104, causing the plurality of pins 122 to be in physical contact with the LM in a respective plurality of holes 108, such that there is a one-to-one correspondence between pins 122 and holes 108, and to thus enable electrical contact between the metal pads 111 of the package substrate 112 and the PCB 102. The pins are described in further detail in connection with FIG. 5.

As mentioned, the PCB 102 may include a metal plate 128 that is strategically located to pair with the magnet 124. In various embodiments, the metal plate 128 is located on the upper surface 132 of the PCB 102 and is configured to substantially mirror the magnet 124 (as used here, substantially mirroring the magnet 124 means it matches a shape, position, and extent, of the magnet 124 by plus or minus 10%). In other words, if the magnet is a closed loop, the metal plate may also be a closed loop, and if the magnet is a partial loop, surrounding only about 80% of the periphery of the package substrate, the metal plate may also surround only about 80% of the package substrate.

Figure 2:
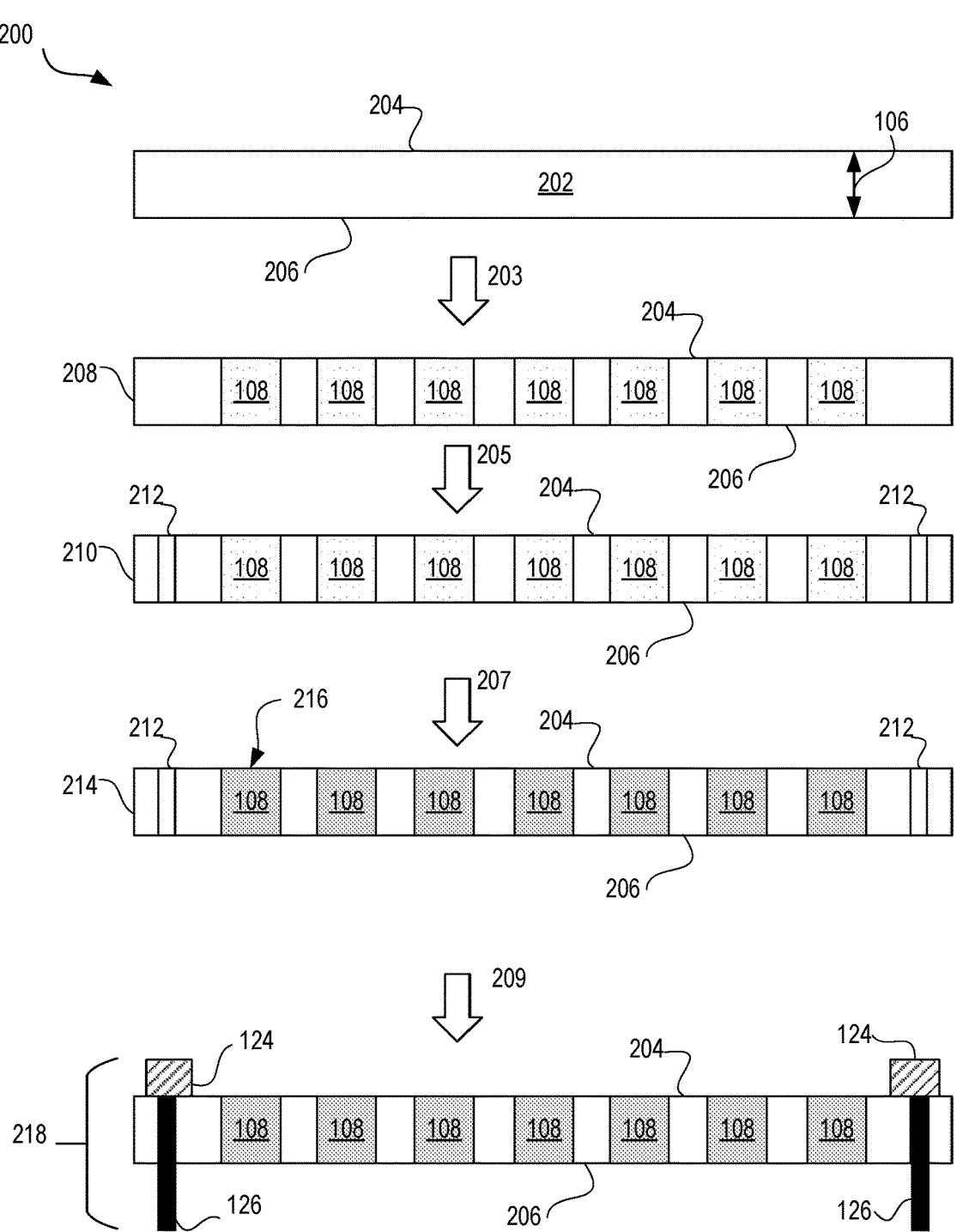
FIG. 2 illustrates features of an interposer, by way of an example process for manufacturing the interposer, in accordance with embodiments.

FIG. 2 illustrates features of the interposer 218, by way of an example process 200 for manufacturing the interposer 218, in accordance with embodiments of the present disclosure. The example process 200 may include additional or different operations, and the operations may be performed in the order shown or in another order. In some cases, one or more of the operations shown in FIG. 2 are implemented as processes that include multiple operations, sub-processes, or other types of routines. In some cases, operations can be combined, performed in another order, performed in parallel, iterated, or otherwise repeated or performed in another manner.

The process 200 begins with a dielectric layer, for example, a polyimide layer 202. The dielectric layer or polyimide layer 202 has an upper surface 204, on which the die 114 can be attached, and a lower surface 206, for attaching to the PCB 102. In various embodiments, the polyimide layer 202 may have a thickness 106 in a range of about 250 to about 400 microns (as used here, about means+/−10%). At 203 the through-holes, holes 108, are placed in the polyimide layer 202, as shown in embodiment 208. The holes 108 may be drilled into the polyimide layer 202, and they may be placed in the polyimide layer 202 in a two-dimensional arrangement, viewed from above (see, FIG. 3, arrangement 304), that is known as a pinout, such as for a BGA package or a LGA package.

At 205, if guideposts 126 are to be used in the embodiment, holes 212 may be added to the polyimide layer 202. The hole 212 is for the purpose of receiving and holding at least a part of a guidepost 126, as depicted in embodiment 210 and embodiment 214. A respective hole 212 is located under the magnet 124 in the final interposer 104.

At 207, LM 216 is put into the holes 108, as illustrated with embodiment 214. At 209, the magnet 124 may be added, and the guideposts 126 may be added, resulting in an embodiment such as depicted by the interposer 218. There may be one or more guideposts 126, the guidepost 126 extends downward from the lower surface 206. In an embodiment, there are two guideposts 126, as depicted in FIG. 2. In various embodiments there are two or more (e.g., 4) guideposts 126, as depicted in FIG. 3.

Figure 3:
FIG. 3 illustrates a top-down view of an interposer, in accordance with various embodiments.
Figure 3:
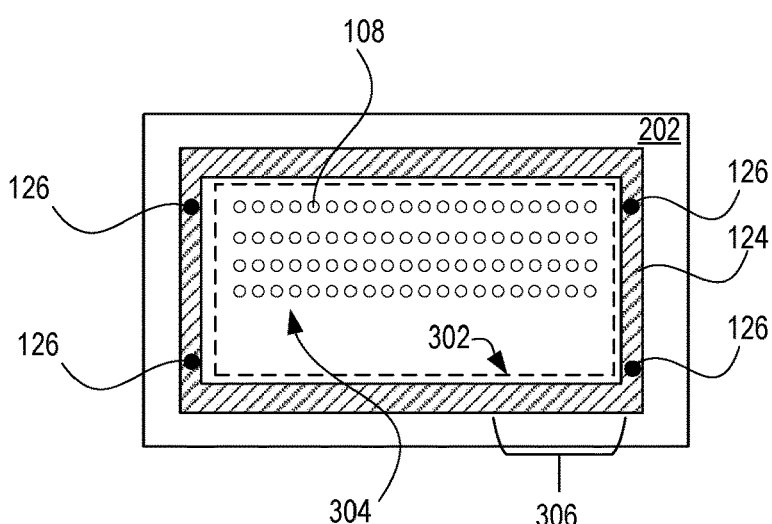

FIG. 3 illustrates a top-down view of an interposer 300, in accordance with various embodiments. A dashed line indicates the periphery 302 of the intended package substrate 112. The dielectric layer or polyimide layer 202 has a predefined arrangement 304 of holes 108 in it, such as an intended BGA or LGA pinout. In various embodiments, the holes 108 have LM therein. The magnet 124 is illustrated as a closed loop, encircling the periphery 302. Although this illustration shows the magnet 124 as being rectangular, with squared corners, those with skill in the art may appreciate that in practice, the magnet 124 may have rounded corners. One or more guideposts 126 may be included. In FIG. 3, there are four guideposts positioned such that one guidepost 126 is generally located at a respective corner of four corners of the periphery 302 of the package substrate 112, as illustrated. The magnet 124 is located above the guideposts 126, therefore, the magnet 124 is illustrated as transparent so that the guideposts 126 can be indicated. As previously mentioned, in some embodiments, the magnet 124 does not completely encircle the periphery 302, for example, a portion 306 may be removed for various reasons, such as, to accommodate another component.

Upon completion of the process for manufacturing the interposer 218 (or interposer 300), the die 114 may be attached to the interposer 218. In various embodiments, upon completion of the process for manufacturing the interposer 218, the package 120 is assembled, including attaching thereto: the die 114, TIM 116, and Cap 118, as described in connection with FIG. 1.

Figure 5:
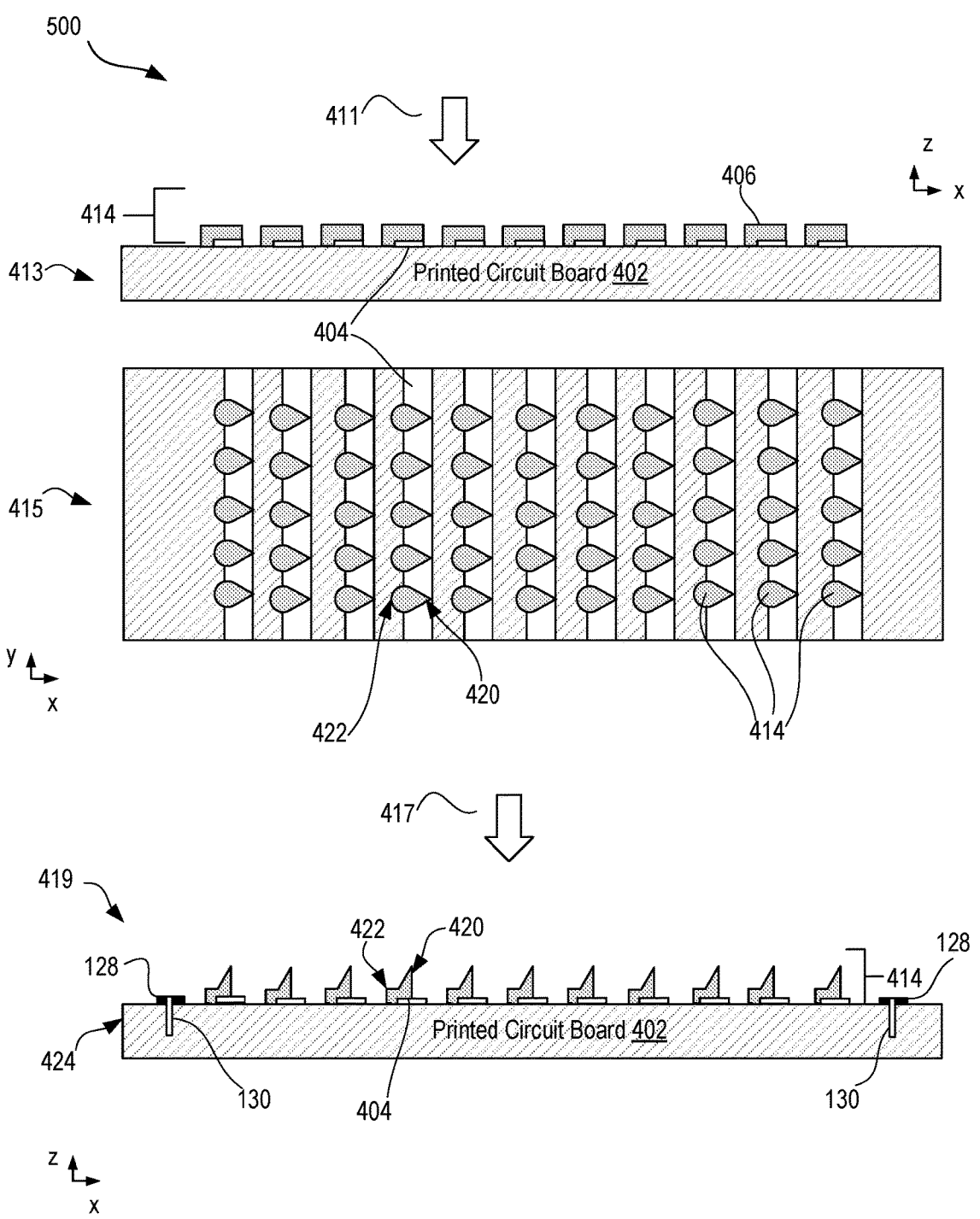

As indicated in FIG. 1, and as part of assembly 100, the PCB 102 may be modified to receive the package 120. FIG. 4 and FIG. 5 illustrate features of the PCB 102, by way of an example process referenced as 400 in FIG. 4 and referenced as 500 in FIG. 5 for manufacturing PCB 102, in accordance with embodiments of the present disclosure. The process 400 begins with attaching relief sheets 404 to the upper surface 132 of the PCB 402. The relief sheets 404 may be rolled onto and attached to the upper surface 132 of the PCB dielectric material, in rows. The relief sheets 404 may comprise any insulative material, e.g., a dry film, plastic, or the like, that may be attached with an adhesive. A position and location of the individual relief sheets 404 may be a function of an intended pinout for the package 120 and hence, die 114. View 401 shows a simplified cross-sectional view of the PCB 102 with relief sheets 404 and view 403 shows a simplified top-down view of the PCB 102 with relief sheets 404.

At 405, a conductive layer 406 is overlaid on the relief sheets 404 on the upper surface 132. In various embodiments, the conductive layer comprises copper. View 407 shows a simplified cross-sectional view of the PCB 102 with relief sheets 404 covered by the conductive layer 406, and view 409 shows a simplified top-down view of the PCB 102 with relief sheets 404 covered by the conductive layer 406.

At 411, the conductive layer is selectively etched to form the shape of the pins 414. View 413 shows a simplified cross-sectional view of the PCB 102 with an edge 424 (referenced in view 419) and with contact pins 414 etched and view 415 shows a simplified top-down view of the PCB 102 with the contact pins etched. Individual pins 414 notably have a base 422 and a tip 420. The base 422 is attached and electrically coupled to the surface of the PCB 102, and the tip 420 is unattached to the PCB 102, it is located on the relief sheet 404. The tip 420 has a shape that is narrower than a shape of the base, yet substantial enough to be tilted upward to result in the surface pin 414 shape and function described herein. The material and overall dimensions of the shape ensure that resulting surface pins 414 are capable of fitting into the respective holes 108 and establishing an electrical connection with the LM in the holes 108.

At 417, the surface pin 414 structure is finalized, as individual pins have their tips 420 tilted upward, as indicated by the cross-sectional view 419. The surface pins are substantially perpendicular (i.e., +/−10%) to the surface of the PCB 102. The operation at 417 may be performed with a tool that slides under a tip 420 of an individual pin 414 and mechanically tilts the tip 420 upward. In various embodiments, analysis of the shape of the surface pin 414 reveals that it has been bent upward during the tilt operation, having an angle between the base 422 and the tip 420 of more than 50°.

Various embodiments use an alignment means configured to provide an alignment reference during the placement of the package 120 on the PCB 102. The alignment means may be removably attached (i.e., the magnet may be removably attached from the interposer 104, the metal plate 128 may be removably attached from the PCB 102, and the guideposts 126 may be removably attached from the interposer 104 and from the PCB 102. A non-limiting example of the alignment means is the illustrated guideposts 126 and magnet 124-metal plate 128, although other means that accomplish the same function may be used. The holes 130 may be drilled to receive guideposts 126 and the metal plate 128 may be added to the upper surface of the PCB 102. In some embodiments, the metal plate 128 is added adjacent to the upper surface of the PCB 102 before the holes 130 are drilled, and holes 130 are drilled through the metal plate 128. The metal plate 128 is located at a periphery of the arrangement of the plurality of surface pins, such that it can align with and pair with the magnet 124 on the interposer 104.

Finally, the package 120 (the interposer 104 (alternatively, the interposer 218), with the package substrate 112 and die 114 attached thereto), may be assembled onto, i.e., attached to, the PCB 102 (e.g., PCB 402), as illustrated with the assembly 600 of FIG. 6. Attaching includes positioning the package 120 such that the array of holes 108 having LM therein are aligned with a matching or respective array of surface pins 414 on the PCB 402 (in various embodiments, this may mean the package 120 and PCB 102 have matching pinouts). When assembled or attached, individual surface pins 414 are inserted into respective holes 108, making an electrical connection with the LM and the respective metal pad 111. When assembled, one or more guideposts 126 are partially inserted into respective holes 130 in the PCB 102 and partially inserted into respective holes 212 in the interposer 104, as illustrated in FIG. 6. Said differently, the guidepost 126 has a first end inserted into a hole 212 in the dielectric layer, such as polyimide layer 202, shown in FIG. 2, and having a second end inserted into a hole 130 in the PCB 102.

Assembly 600 can be completed in an operation using a pick-and-place machine, using the alignment means as an alignment reference. In an example, the guidepost 126 may be the alignment reference. Advantageously, assembly does not require a reflow process, and therefore, does not invoke the issues with heat described above. While many labels in FIG. 6 are removed to make the assembly 600 easier to view, a comparison with FIG. 1 can be used for reference, as like objects have same identities.

Accordingly, various non-limiting embodiments of a substrate to board interconnect with liquid metal and surface pins have been described. The provided embodiments advantageously use a liquid metal (LM) applied to a drilled dielectric (polyimide layer) in a BGA replacement strategy. The LM is desirable as it has a high elastic characteristic, is relatively easy to cast and mold, provides a high wear resistance, and has a relatively good conductivity. The PCB is manufactured to include surface pins such that a pick and place assembly can be done without needing a reflow step. Averting the reflow step increases the ability to repair and replace the assemblies. Embodiments also may include guideposts and a magnetic ring/metal sheet for alignment.

Figure 7:
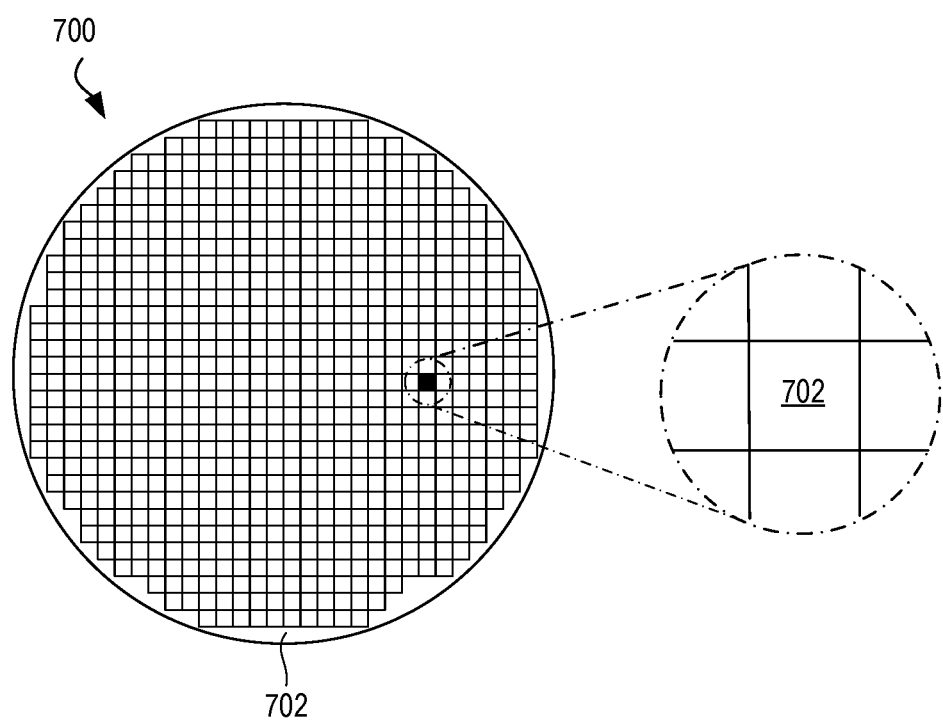
FIG. 7 is a top view of a wafer and dies that may be included in a microelectronic assembly, in accordance with any of the embodiments disclosed herein.

FIG. 7 is a top view of a wafer 700 and dies 702 that may be included in any of the embodiments disclosed herein. The wafer 700 may be composed of semiconductor material and may include one or more dies 702 formed on a surface of the wafer 700. After the fabrication of the integrated circuit components on the wafer 700 is complete, the wafer 700 may undergo a singulation process in which the dies 702 are separated from one another to provide discrete "chips" or destined for a packaged integrated circuit component. The individual dies 702, comprising an integrated circuit component, may include one or more transistors (e.g., some of the transistors 840 of FIG. 8, discussed below), supporting circuitry to route electrical signals to the transistors, passive components (e.g., signal traces, resistors, capacitors, or inductors), and/or any other integrated circuit components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Additionally, multiple devices may be combined on a single die 702. For example, a memory array formed by multiple memory devices may be formed on a same die 702 as a processor unit (e.g., the processor unit 1002 of FIG. 10) or other logic that is configured to store information in the memory devices or execute instructions stored in the memory array. In some embodiments, a die 702 may be attached to a wafer 700 that includes other die, and the wafer 700 is subsequently singulated, this manufacturing procedure is referred to as a die-to-wafer assembly technique.

Figure 8:
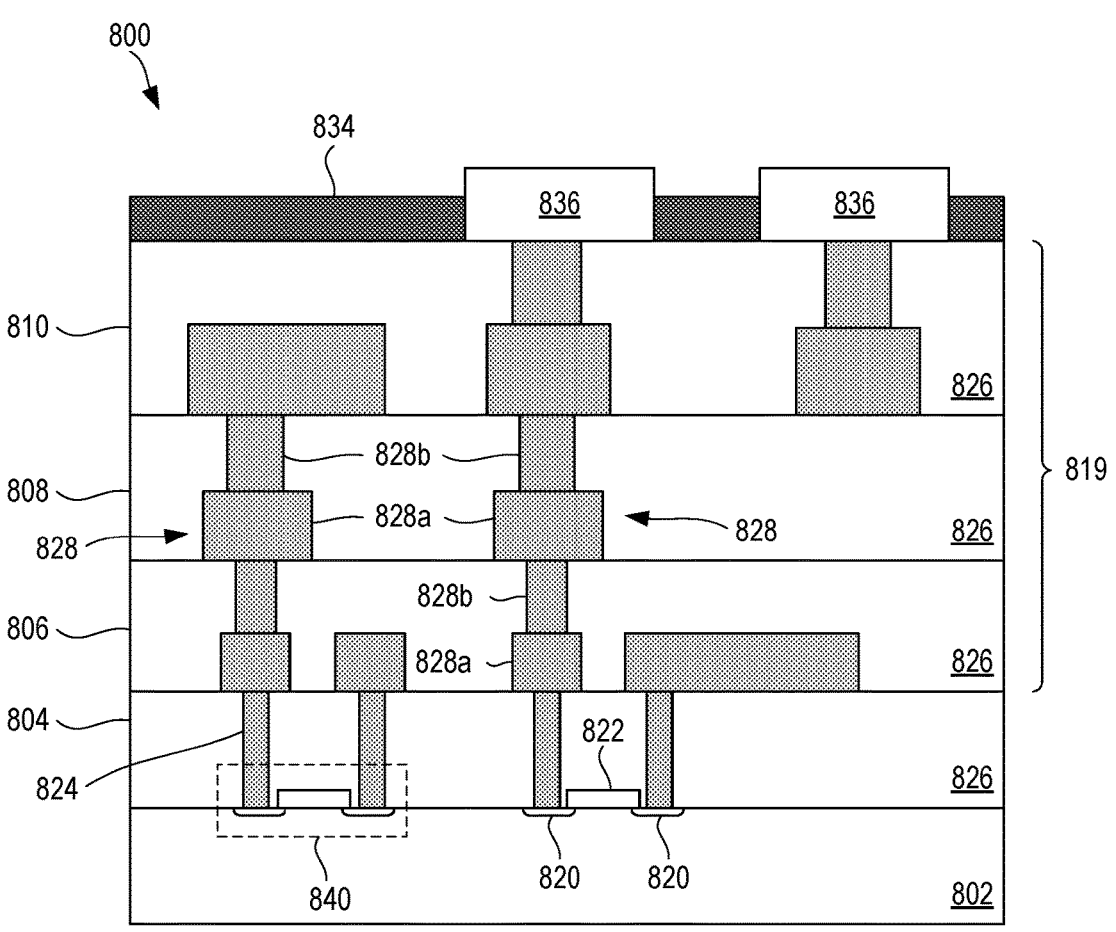
FIG. 8 is a simplified cross-sectional side view showing an implementation of an integrated circuit on a die that may be included in various embodiments, in accordance with any of the embodiments disclosed herein.

FIG. 8 is a cross-sectional side view of an integrated circuit 800 that may be included in any of the embodiments disclosed herein. One or more of the integrated circuits 800 may be included in one or more dies 702 (FIG. 7). The integrated circuit 800 may be formed on a die substrate 802 (e.g., the wafer 700 of FIG. 7) and may be included in a die (e.g., the die 702 of FIG. 7).

The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit 800 may be used. The die substrate 802 may be part of a singulated die (e.g., the dies 702 of FIG. 7) or a wafer (e.g., the wafer 700 of FIG. 7).

The integrated circuit 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820.

The gate 822 may be formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be conducted on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may comprise a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may comprise a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may comprise a combination of U-shaped structures and planar, non-U-shaped structures. For example, the gate electrode may comprise one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be conducted to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuits having more or fewer interconnect layers than depicted.

In some embodiments, the interconnect structures 828 may include lines 828*a* and/or vias 828*b* filled with an electrically conductive material such as a metal. The lines 828*a* may be arranged to route electrical signals in a direction of a plane that is substantially parallel with a surface of the die substrate 802 upon which the device layer 804 is formed. For example, the lines 828*a* may route electrical signals in a direction in and out of the page and/or in a direction across the page. The vias 828*b* may be arranged to route electrical signals in a direction of a plane that is substantially perpendicular to the surface of the die substrate 802 upon which the device layer 804 is formed. In some embodiments, the vias 828*b* may electrically couple lines 828*a* of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828*a* and/or vias 828*b*, as shown. The lines 828*a* of the first interconnect layer 806 may be coupled with contacts (e.g., the S/D contacts 824) of the device layer 804. The vias 828*b* of the first interconnect layer 806 may be coupled with the lines 828*a* of a second interconnect layer 808.

The second interconnect layer 808 (referred to as Metal 2 or "M2") may be formed directly on the first interconnect layer 806. In some embodiments, the second interconnect layer 808 may include via 828*b* to couple the lines 828*a* of the second interconnect layer 808 with the lines 828*a* of a third interconnect layer 810. Although the lines 828*a* and the vias 828*b* are structurally delineated with a line within individual interconnect layers for the sake of clarity, the lines 828*a* and the vias 828*b* may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit 800 (i.e., farther away from the device layer 804) may be thicker than the interconnect layers that are lower in the metallization stack 819, with lines 828*a* and vias 828*b* in the higher interconnect layers being thicker than those in the lower interconnect layers.

The integrated circuit 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit 800 with another component (e.g., a printed circuit board). The integrated circuit 800 may include additional or alternate structures to route the electrical signals from the interconnect layers 806-810; for example, the conductive contacts 836 may include other analogous features (e.g., posts) that route the electrical signals to external components.

In some embodiments in which the integrated circuit 800 is a double-sided die, the integrated circuit 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit 800 from the conductive contacts 836.

In other embodiments in which the integrated circuit 800 is a double-sided die, the integrated circuit 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit 800 from the conductive contacts 836. In some embodiments, TSVs extending through the substrate can be used for routing power and ground signals from conductive contacts on the opposite side of the integrated circuit 800 from the conductive contacts 836 to the transistors 840 and any other components integrated into the die 702, and the metallization stack 819 can be used to route I/O signals from the conductive contacts 836 to transistors 840 and any other components integrated into the die 702.

Multiple integrated circuits 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
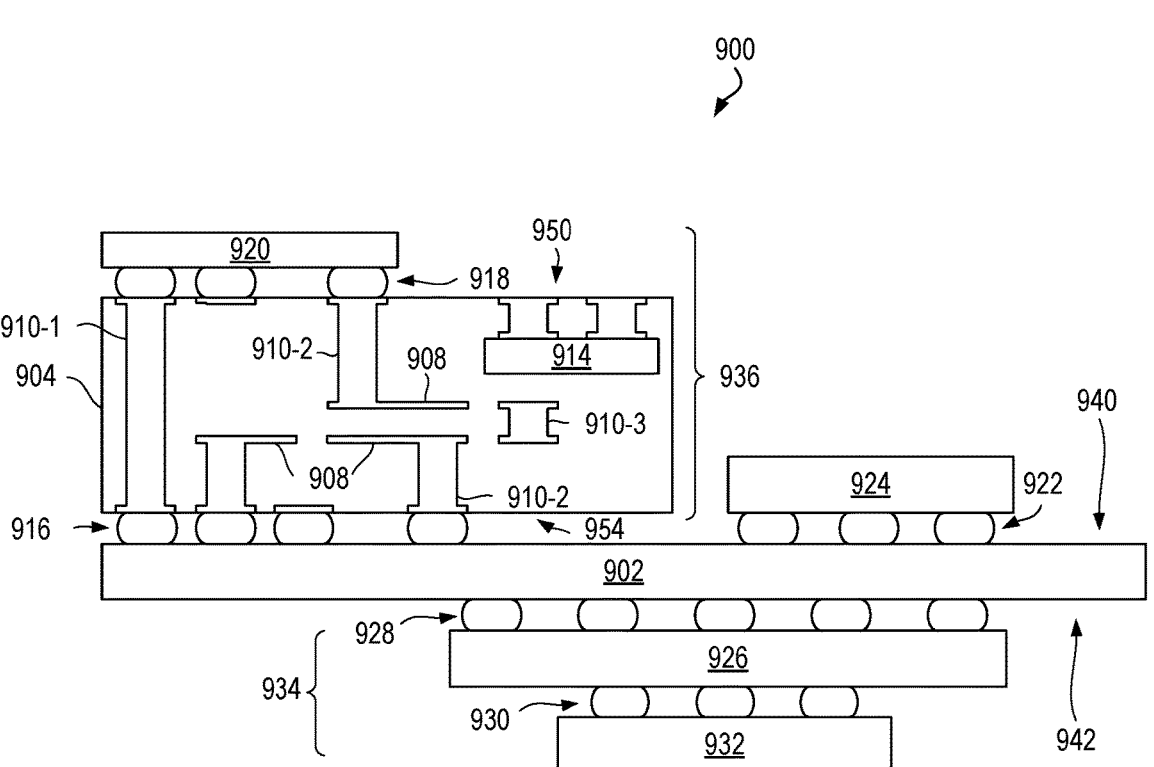
FIG. 9 is a cross-sectional side view of a microelectronic assembly that may include any of the embodiments disclosed herein.

FIG. 9 is a cross-sectional side view of a microelectronic assembly 900 that may include any of the embodiments disclosed herein. The microelectronic assembly 900 includes multiple integrated circuit components disposed on a circuit board 902 (which may be a motherboard, system board, mainboard, etc.). The microelectronic assembly 900 may include components disposed on a first face 940 of the circuit board 902 and an opposing second face 942 of the circuit board 902; generally, components may be disposed on one or both faces 940 and 942.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The microelectronic assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904.

The interposer 904 may provide an intervening substrate used to bridge the circuit board 902 and the integrated circuit component 920.

The integrated circuit component 920 may be a packaged or unpackaged integrated circuit component that includes one or more integrated circuit dies (e.g., the die 702 of FIG. 7, the integrated circuit 800 of FIG. 8) and/or one or more other suitable components.

The unpackaged integrated circuit component 920 comprises solder bumps attached to contacts on the die. The solder bumps allow the die to be directly attached to the interposer 904. In embodiments where the integrated circuit component 920 comprises multiple integrated circuit dies, the dies can be of the same type (a homogeneous multi-die integrated circuit component) or of two or more different types (a heterogeneous multi-die integrated circuit component). In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies are sometimes referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof. A packaged multi-die integrated circuit component can be referred to as a multi-chip package (MCP) or multi-chip module (MCM).

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The integrated circuit assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
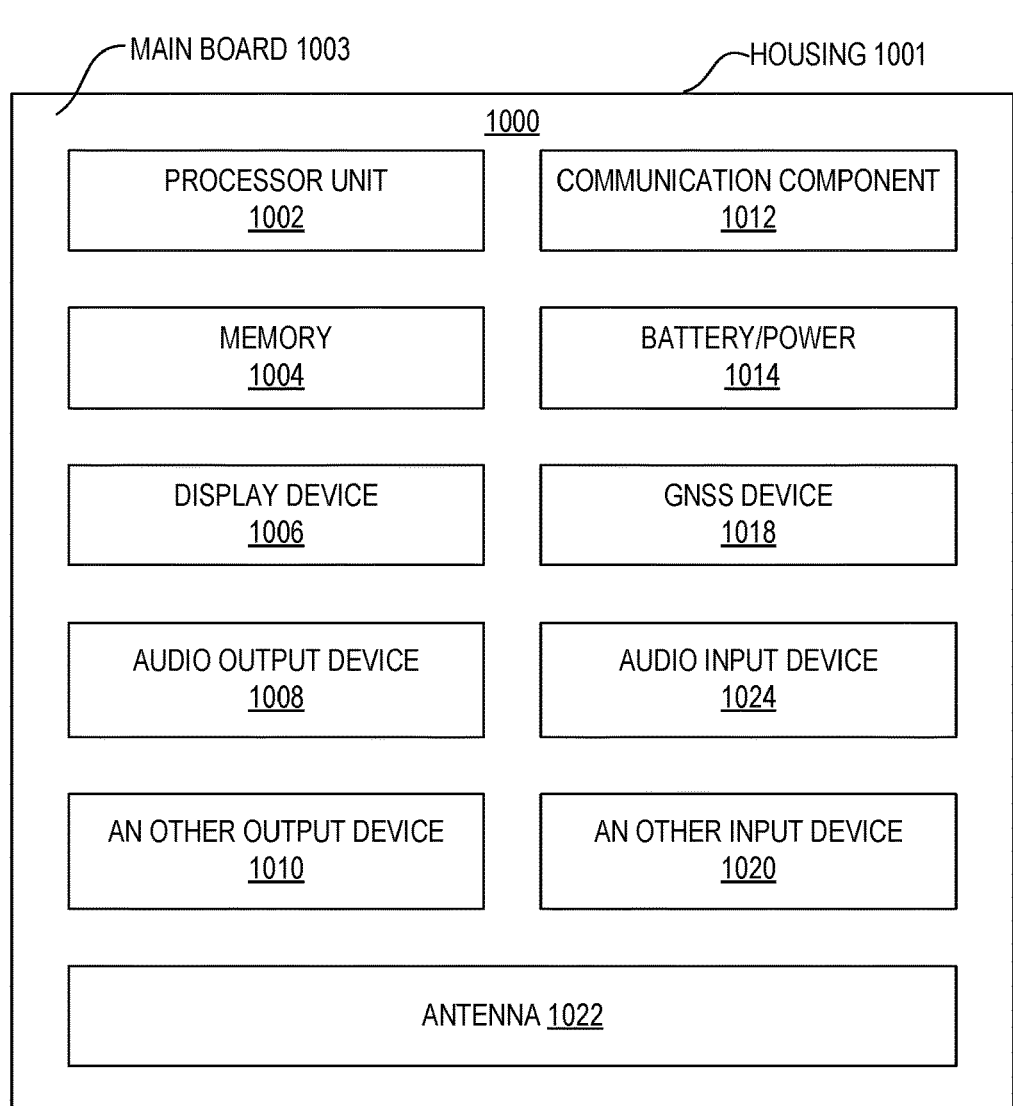
FIG. 10 is a block diagram of an example electrical device that may include any of the embodiments disclosed herein.

FIG. 10 is a block diagram of an example electrical device 1000 that may include one or more of the embodiments disclosed herein. For example, any suitable ones of the components of the electrical device 1000 may include one or more of the microelectronic assemblies 900, integrated circuit components 920, integrated circuits 800, integrated circuit dies 702, or structures disclosed herein. A number of components are illustrated in FIG. 10 as included in the electrical device 1000, but any one or more of these components may be omitted or duplicated, as suitable for the application. In some embodiments, some or all the components included in the electrical device 1000 may be attached to one or more motherboards, mainboards 1003, printed circuit boards, or system boards. In some embodiments, one or more of these components are fabricated onto a single system-on-a-chip (SoC) die. In various embodiments, the electrical device 1000 is enclosed by, or integrated with, a housing 1001.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller crypto processors (specialized processors that execute cryptographic algorithms within hardware), server processors, controllers, or any other suitable type of processor units. As such, the processor unit can be referred to as an XPU (or xPU).

The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 1000 can comprise one or more processor units 1002 that are heterogeneous or asymmetric to another processor unit 1002 in the electrical device 1000. There can be a variety of differences between the processor units 1002 in a system in terms of a spectrum of metrics of merit including architectural, micro-architectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data using modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such as speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussion above). Examples of the other input device 1020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. Various changes can be made in the function and arrangement of elements without departing from the scope of the disclosure as set forth in the appended claims and the legal equivalents thereof.

As used herein, phrases such as "an embodiment," "various embodiments," "some embodiments," and the like, indicate that some embodiments may have some, all, or none of the features described for other embodiments. "First," "second," "third," and the like describe a common object and indicate different instances of like objects being referred to; unless specifically stated, they do not imply a given sequence, either temporally or spatially, in ranking, or any other manner. In accordance with patent application parlance, "connected" indicates elements that are in direct physical or electrical contact with each other and "coupled" indicates elements that co-operate or interact with each other, coupled elements may or may not be in direct physical or electrical contact. Furthermore, the terms "comprising," "including," "having," and the like, are utilized synonymously to denote non-exclusive inclusions.

As used in this application and the claims, a list of items joined by the term "at least one of" or the term "one or more of" can mean any combination of the listed terms. For example, the phrase "at least one of A, B or C" can mean A; B; C; A and B; A and C; B and C; or A, B, and C. Likewise, the phrase "one or more of A, B and C" can mean A; B; C; A and B; A and C; B and C; or A, B, and C.

As used in this application and the claims, the phrase "individual of" or "respective of" following by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

EXAMPLES

Example 1 is an apparatus including: a dielectric layer comprising an upper surface and a lower surface, the dielectric layer having a plurality of holes from the upper surface to the lower surface; individual holes of the plurality of holes having a LM therein, e.g., being filled with a liquid metal (LM) that extends from the lower surface to the upper surface; and a magnet located on the upper surface.

Example 2 includes the subject matter of Example 1, further comprising a guidepost extending downward from the lower surface.

Example 3 includes the subject matter of Example 2, wherein the guidepost is a first guidepost and further comprising a second guidepost extending from the lower surface.

Example 4 includes the subject matter of Example 1, further comprising a package substrate having metal pads, the metal pads being electrically coupled to the LM at the upper surface.

Example 5 includes the subject matter of Example 1, further comprising: a package substrate having metal pads, the metal pads electrically coupled to the LM at the upper surface; and a die coupled to the package substrate.

Example 6 includes the subject matter of Example 5, further comprising
a thermal interface material (TIM) located on the die; and a cap enclosing the die and TIM on a top surface of the package substrate.

Example 7 includes the subject matter of Example 1, wherein the LM comprises gallium.

Example 8 includes the subject matter of Example 1, wherein the LM comprises gallium and oxygen.

Example 9 includes the subject matter of Example 1, wherein the LM comprises Ga2O3.

Example 10 includes the subject matter of Example 1, wherein the LM comprises indium, tin, or zinc.

Example 11 includes the subject matter of Example 1, wherein the dielectric layer comprises a thickness in a range of 250 to 400 microns.

Example 12 includes the subject matter of Example 4 or Example 5, wherein the plurality of holes has a predefined arrangement or pinout that matches the metal pads.

Example 13 includes the subject matter of any one of Examples 1-12, further comprising: a printed circuit board (PCB) having a plurality of surface pins, the PCB located adjacent to the lower surface of the dielectric layer; and individual surface pins of the plurality of surface pins extending into a respective hole, thereby establishing an electrical connection with a respective metal pad.

Example 14 includes the subject matter of Example 13, further comprising an integrated circuit component attached to the PCB.

Example 15 includes the subject matter of Example 13 or Example 14, further comprising: a metal plate, the metal plate located on the PCB; and the magnet paired to the metal plate.

Example 16 includes the subject matter of any one of Examples 1-15, wherein the dielectric layer is a polyimide layer.

Example 17 includes the subject matter of Example 13, wherein the surface pins are substantially perpendicular to the PCB.

Example 18 is an assembly, comprising: a package comprising a die coupled to an upper surface of a package substrate, and a dielectric layer located under the package substrate, the dielectric layer comprising a plurality of holes that have a liquid metal (LM) therein; a printed circuit board (PCB) having a respective plurality of surface pins; and the package located on the PCB, with individual of the surface pins inserted into respective holes in the package substrate.

Example 19 includes the subject matter of Example 18, further comprising: a magnet located on the dielectric layer; and a metal plate located on the PCB and magnetically attached to the magnet.

Example 20 includes the subject matter of Example 18, further comprising a guidepost having a first end inserted into the dielectric layer and having a second end inserted in the PCB.

Example 21 includes the subject matter of Example 18, wherein the dielectric layer is a polyimide layer.

Example 22 includes the subject matter of Example 18, wherein the LM comprises Gallium.

Example 23 includes the subject matter of Example 18, wherein the LM comprises Gallium and Oxygen.

Example 24 includes the subject matter of Example 18, wherein the LM comprises Ga2O3.

Example 25 includes the subject matter of Example 18, wherein the LM comprises Indium, Tin, or Zinc.

Example 26 includes the subject matter of Example 18, wherein the dielectric layer comprises a thickness in a range of 250 to 400 microns.

Example 27 includes the subject matter of Example 18, wherein the surface pins comprise copper.

Example 28 is a system, comprising: a printed circuit board (PCB) having a plurality of surface pins arranged in a pinout; an integrated circuit component attached to the PCB; a package comprising a die coupled to an upper surface of a package substrate, and a dielectric layer located under the package substrate, the dielectric layer comprising a plurality of holes arranged in the pinout, the holes having a liquid metal therein; and the package is attached at a lower surface of the package substrate to the PCB, such that individual surface pins of the plurality of surface pins are inserted into a respective hole in the package.

Example 29 includes the subject matter of Example 28, further comprising: a magnet located on the dielectric layer; and a metal plate located on the PCB and paired with the magnet.

Example 30 includes the subject matter of Example 28, further comprising a guidepost having a first end inserted into the dielectric layer and having a second end inserted in the PCB.

Example 31 includes the subject matter of Example 28, wherein the dielectric layer is a polyimide layer.

Example 32 is a method for forming a package, comprising: forming a plurality of holes in a dielectric layer; filling the plurality of holes with a liquid metal; and attaching a package substrate to a first side of the dielectric layer.

Example 33 includes the subject matter of Example 32, further comprising attaching a magnet to the first side of the dielectric layer.

Example 34 includes the subject matter of Example 32, wherein the plurality of holes is a plurality of first holes, the first holes being arranged in a pinout, and further comprising forming a second hole in the dielectric layer at a periphery of the pinout.

Example 35 includes the subject matter of Example 34, further comprising attaching a guidepost in the second hole.

Example 36 includes the subject matter of any one of Examples 32-35, further comprising, attaching the package to a printed circuit board (PCB), wherein attaching includes aligning the plurality of holes with a respective plurality of surface pins on the PCB.

Example 37 is an apparatus comprising: a dielectric layer comprising an upper surface and a lower surface, the dielectric layer having a plurality of holes from the upper surface to the lower surface; individual holes of the plurality of holes having a liquid metal (LM) therein, the LM extending from the lower surface to the upper surface; and an alignment means attached to the dielectric layer.

Example 38 includes the subject matter of Example 37, wherein the alignment means comprises a magnet.

Example 39 includes the subject matter of Example 37, wherein the alignment means comprises a guidepost.

Example 40 includes the subject matter of Example 37, wherein the alignment means comprises a magnet and a guidepost.

Example 41 includes the subject matter of any of Examples 37-40, further comprising a package substrate having metal pads, the metal pads being electrically coupled to the LM at the upper surface.

Example 42 includes the subject matter of Example 41, further comprising a die coupled to the package substrate.

Example 43 includes the subject matter of Example 42, further comprising: a thermal interface material (TIM) located on the die; and a cap enclosing the die and TIM on a top surface of the package substrate.

Example 44 includes the subject matter of Example 42, wherein the LM comprises gallium.

Example 45 includes the subject matter of Example 42, wherein the LM comprises gallium and oxygen.

Example 46 includes the subject matter of Example 42, wherein the LM comprises Ga2O3.

Example 47 includes the subject matter of Example 42, wherein the LM comprises indium, tin, or zinc.

Example 48 includes the subject matter of Example 42, wherein the dielectric layer comprises a thickness in a range of 250 to 400 microns.

What is claimed is:

1. An apparatus comprising:
   a dielectric layer comprising an upper surface and a lower surface, the dielectric layer having a plurality of holes from the upper surface to the lower surface;
   individual holes of the plurality of holes having a liquid metal (LM) therein, the LM extends from the lower surface to the upper surface;
   a package substrate having metal pads, the metal pads to be electrically coupled to the LM at the upper surface of the dielectric layer; and
   a magnet located on the upper surface of the dielectric layer and at least substantially surrounding a perimeter of the package substrate.

2. The apparatus of claim 1, further comprising a guidepost extending downward from the lower surface.

3. The apparatus of claim 2, wherein the guidepost is a first guidepost and further comprising a second guidepost extending from the lower surface.

4. The apparatus of claim 1, further comprising:
   a die coupled to the package substrate.

5. The apparatus of claim 4, further comprising:
   a thermal interface material (TIM) located on the die; and
   a cap enclosing the die and TIM on a top surface of the package substrate.

6. The apparatus of claim 1, wherein the LM comprises gallium.

7. The apparatus of claim 1, wherein the LM comprises indium, tin, or zinc.

8. The apparatus of claim 1, wherein the dielectric layer comprises a thickness in a range of 250 to 400 microns.

9. The apparatus of claim 1, further comprising:
   a printed circuit board (PCB) having a plurality of surface pins, the PCB located adjacent to the lower surface of the dielectric layer; and
   individual surface pins of the plurality of surface pins extending into a respective hole, thereby establishing an electrical connection with a respective metal pad.

10. The apparatus of claim 9, further comprising an integrated circuit component attached to the PCB.

11. The apparatus of claim 9, further comprising:
    a metal plate, the metal plate located on the PCB; and
    the magnet paired to the metal plate.

12. The apparatus of claim 1, wherein the dielectric layer is a polyimide layer.

13. An assembly, comprising:
    a package comprising a package substrate, a die coupled to a top surface of the package substrate, and a dielectric layer located under the package substrate, the dielectric layer comprising a plurality of holes having a liquid metal (LM) therein;

a printed circuit board (PCB) having a plurality of surface pins;

the package located on the PCB, with individual surface pins of the plurality of surface pins inserted into respective holes in the package; and a magnet removably attached to an upper surface of the dielectric layer.

14. The assembly of claim 13, further comprising:

a metal plate located on the PCB and magnetically attached to the magnet.

15. The assembly of claim 13, further comprising a guidepost having a first end inserted into the dielectric layer and having a second end inserted in the PCB.

16. The assembly of claim 13, wherein the dielectric layer is a polyimide layer.

17. The assembly of claim 13, wherein the dielectric layer comprises a thickness in a range of 250 to 400 microns.

18. The assembly of claim 13, wherein the plurality of surface pins comprises copper.

19. A system, comprising:

a printed circuit board (PCB) having a plurality of surface pins arranged in a pinout;

an integrated circuit component attached to the PCB;

a package comprising a package substrate, a die coupled to a top surface of the package substrate, and a layer located under the package substrate, the layer comprising polyimide, wherein a plurality of holes are arranged in the pinout, the plurality of holes having a liquid metal therein;

the package is attached at a lower surface of the layer to the PCB, such that individual surface pins of the plurality of surface pins are inserted into a respective hole in the package; and a magnet located on an upper surface of the layer and at least substantially surrounding a perimeter of the package substrate.

20. The system of claim 19, further comprising:

a metal plate located on the PCB and paired with the magnet.

21. The system of claim 19, further comprising a guidepost having a first end inserted into the layer and having a second end inserted in the PCB.

22. An apparatus comprising:

a layer comprising polyimide, an upper surface, and a lower surface, the layer having a plurality of holes from the upper surface to the lower surface;

individual holes of the plurality of holes having a liquid metal (LM) therein that extends from the lower surface to the upper surface;

a package substrate including a backside adjacent to the upper surface of the layer; and an alignment means removably attached to the layer and located at a periphery of the package substrate, the alignment means configured to provide alignment reference in assembly.

23. The apparatus of claim 22, wherein the alignment means comprises a magnet or a guidepost.

24. The apparatus of claim 22, wherein the alignment means comprises both a magnet and a guidepost.

25. The assembly of claim 13, wherein the magnet at least substantially surrounds a perimeter of the package substrate.

* * * * *